US008796676B2

(12) United States Patent
Pieh et al.

(10) Patent No.: US 8,796,676 B2
(45) Date of Patent: Aug. 5, 2014

(54) TANDEM WHITE ORGANIC LIGHT EMITTING DEVICE

(71) Applicant: LG Display Co., Ltd., Seoul (KR)

(72) Inventors: Sung-Hoon Pieh, Seoul (KR); Chang-Wook Han, Seoul (KR); Hong-Seok Choi, Seoul (KR); Jeong-Dae Seo, Incheon (KR); Ki-Woog Song, Jeonbuk (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 13/678,609

(22) Filed: Nov. 16, 2012

(65) Prior Publication Data

US 2013/0146850 A1 Jun. 13, 2013

(30) Foreign Application Priority Data

Dec. 8, 2011 (KR) ................. 10-2011-0131378

(51) Int. Cl.
*H01L 29/08* (2006.01)
*H01L 35/24* (2006.01)

(52) U.S. Cl.
USPC ........................................................ 257/40

(58) Field of Classification Search
CPC .............. H01L 27/3209; H01L 2251/5361; H01L 25/167; H01L 51/0032; H01L 51/5012; H01L 51/504; H01L 51/5296; H01L 51/50; A63F 2009/2454
USPC .............. 257/40, 13, 79–103, 918, 257/E33.001–E33.077, E29.069–E29.071, 257/E29.246, E49.001–E49.004, E21.404, 257/E39.007, E51.001–E51.052, 257/E27.117–E27.119, 789–794, 257/E25.008–E25.009, 116, 117, 432–437, 257/749, E25.032, 457, 459; 438/22–47, 438/69, 493, 503, 507, 956, 82, 99, 51, 55, 438/64–68, 83, 98
See application file for complete search history.

(56) References Cited

U.S. PATENT DOCUMENTS

| 7,829,907 B2 * | 11/2010 | Ide et al. ..................... 257/98 |
| 2007/0046189 A1 | 3/2007 | Hatwar et al. |
| 2008/0297036 A1 * | 12/2008 | Noh et al. ..................... 313/504 |
| 2009/0191428 A1 | 7/2009 | Hatwar et al. |

(Continued)

FOREIGN PATENT DOCUMENTS

| EP | 1408563 A2 | 4/2004 |
| EP | 2045847 A2 | 4/2009 |

(Continued)

OTHER PUBLICATIONS

Cheng et al., "Role of the Charge Generation Layer in Tandem Organic Light-Emitting Diodes Investigated by Time-Resolved Electroluminescence Spectroscopy," Journal of Physical Chemistry C, 115: No. 2; 582-588 (2011).

(Continued)

*Primary Examiner* — Dao H Nguyen
*Assistant Examiner* — Tram H Nguyen
(74) *Attorney, Agent, or Firm* — Morgan, Lewis & Bockius LLP (57) ABSTRACT

A tandem white organic light emitting device with improved efficiency, voltage and lifetime includes a first electrode and a second electrode opposing each other, a charge generation layer formed between the first electrode and the second electrode, a first stack disposed between the first electrode and the charge generation layer, the first stack including a first light emitting layer emitting blue light, and a second stack disposed between the charge generation layer and the second electrode, the second stack including a second light emitting layer including one or more hosts doped with a phosphorescent dopant emitting light having a longer wavelength than blue light, wherein the charge generation layer includes an n-type charge generation layer doped with a metal and a p-type charge generation layer made of an organic material.

13 Claims, 5 Drawing Sheets

(56) References Cited

U.S. PATENT DOCUMENTS

| | | |
|---|---|---|
| 2009/0230415 A1 | 9/2009 | Ide et al. |
| 2011/0073844 A1 | 3/2011 | Pieh et al. |
| 2011/0121320 A1* | 5/2011 | Pieh et al. .................... 257/79 |
| 2013/0073844 A1* | 3/2013 | Shimada .................... 713/156 |

FOREIGN PATENT DOCUMENTS

| | | |
|---|---|---|
| KR | 10-2008-0051171 A | 10/2008 |
| KR | 10-2011-0035048 A | 6/2011 |
| WO | 2012/053627 A1 | 4/2012 |

OTHER PUBLICATIONS

Combined Search and Examination Report issued in counterpart Great Britain Patent Application No. 1222004.2 dated Mar. 25, 2013.

Office Action dated Mar. 28, 2014 from the Korea Patent Office in counterpart Korean application No. 10-2011-0131378.

* cited by examiner

TANDEM WHITE ORGANIC LIGHT EMITTING DEVICE

This application claims the benefit of Korean Patent Application No. 10-2011-0131378, filed on Dec. 8, 2011, which is hereby incorporated by reference as if fully set forth herein.

BACKGROUND OF THE INVENTION

1. Field of the Invention

The present invention relates to a white organic light emitting device. More specifically, the present invention relates to a tandem white organic light emitting device, efficiency, voltage and lifetime of which are improved by changing a configuration of a charge generation layer.

2. Discussion of the Related Art

The recent trend toward information-dependent age has brought about rapid development in display fields that visually display electrical information signals. In this regard, a variety of flat display devices having superior properties such as slimness, light weight and low power consumption have been developed and are actively used as substitutes for conventional cathode ray tubes (CRTs).

Specific examples of flat display devices include liquid crystal display devices (LCDs), plasma display panel devices (PDPs), field emission display devices (FEDs), organic light emitting devices (OLEDs) and the like.

Among these, organic light emitting devices that do not require an additional light source, realize a compact design and render clear color are considered to be competitive applications.

Organic light emitting display devices require formation of organic light emitting layers. The formation of organic light emitting layers is generally carried out by a deposition method using a shadow mask.

However, a large-area shadow mask may be bent due to load. For this reason, it is impossible to use the large-area shadow mask several times, and defects associated with pattern formation of organic light emitting layers occur. Accordingly, there is a demand for an alternative method.

A tandem organic light emitting device (hereinafter, referred to as "tandem organic light emitting device") suggested as an alternative to the shadow mask will be described below.

The tandem organic light emitting device is characterized in that respective light emitting diode layers interposed between an anode and a cathode are deposited without using a mask, and organic films including the organic light emitting layers are sequentially deposited under vacuum using different materials.

Meanwhile, realization of white light using a tandem organic light emitting device may be performed by mixing light emitted from two or more light emitting layers. In this case, the tandem organic light emitting device includes a plurality of light emitting layers that emit light with different colors that are interposed between an anode and a cathode, and a charge generation layer (CGL) provided between respective light emitting layers. Stacks are separated, based on each light emitting layer.

In such a tandem organic light emitting device, one material does not emit light and a plurality of light emitting layers containing light emitting materials having different photoluminescence peaks (PL peaks) at respective wavelengths emit light at different positions of the device and the light is combined to realize light emission.

However, the conventional tandem organic light emitting device has the following problems.

The tandem device includes a charge generation layer between different stacks. Also, the charge generation layer transports electrons or holes to an adjacent stack. In this regard, when a charge generation layer is formed using the material commonly used for the tandem device, transport of electrons or holes between the adjacent stack and the charge generation layer may be impossible due to poor interface properties of the stacks adjacent to the charge generation layer. In this case, emission of light may normally occur in the adjacent phosphorescent or fluorescent stack.

Accordingly, a great deal of research to find factors that block injection of holes or electrons from the charge generation layer to adjacent stacks is underway.

SUMMARY OF THE INVENTION

Accordingly, the present invention is directed to a tandem white organic light emitting device that substantially obviates one or more problems due to limitations and disadvantages of the related art.

It is one object of the present invention to provide a tandem white organic light emitting device, efficiency, voltage and lifetime of which are improved by changing a configuration of a charge generation layer.

In accordance with one aspect of the present invention, provided is a tandem white organic light emitting device including: a first electrode and a second electrode opposing each other; a charge generation layer formed between the first electrode and the second electrode; a first stack disposed between the first electrode and the charge generation layer, the first stack including a first light emitting layer emitting blue light; and a second stack disposed between the charge generation layer and the second electrode, the second stack including a second light emitting layer including one or more hosts doped with a phosphorescent dopant emitting light having a longer wavelength than blue light, wherein the charge generation layer includes an n-type charge generation layer doped with a metal and a p-type charge generation layer made of an organic material.

The metal doped in the n-type charge generation layer may be a Group I or II metal. For example, the metal may be any one of lithium, sodium, magnesium, calcium and cesium.

An amount of metal doped in the n-type charge generation layer may be 2% to 8% of the total volume of the n-type charge generation layer.

A thickness of the metal doped in the n-type charge generation layer may be 100 Å to 150 Å.

A HOMO energy level of the p-type charge generation layer may be −5 eV or less.

The n-type charge generation layer may have a fused aromatic ring containing a hetero ring.

The first stack may further include: a first common layer disposed between the first electrode and the first light emitting layer; and a second common layer disposed between the first light emitting layer and the charge generation layer, and the second stack further may further include: a third common layer disposed between the charge generation layer and the second light emitting layer; and a fourth common layer disposed between the second light emitting layer and the second electrode.

The third common layer and the fourth common layer may have a triplet energy level 0.01 eV to 0.4 eV higher than a triplet energy level of the host present in the second light emitting layer.

The first light emitting layer may emit blue fluorescence.

A phosphorescent dopant of the second light emitting layer may include a yellow-green phosphorescent dopant, a yellow phosphorescent dopant and a green phosphorescent dopant, or a red phosphorescent dopant and a green phosphorescent dopant.

The second light emitting layer may comprises two or more hosts and the hosts includes at least first host having an electron transport property and a second host having a hole transport property.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide further understanding of the disclosure and are incorporated in and constitute a part of this application, illustrate embodiments of the disclosure and together with the description serve to explain the principle of the disclosure. In the drawings.

DETAILED DESCRIPTION OF THE INVENTION

Reference will now be made in detail to the specific embodiments of the present invention, examples of which are illustrated in the accompanying drawings.

Hereinafter, a tandem white organic light emitting device according to the present invention will be described in detail with reference to the accompanying drawings.

In particular, the tandem white organic light emitting device according to the present invention that can facilitate injection of electrons and holes into adjacent stacks by changing design conditions of a charge generation layer and prevent lateral leakage by controlling an amount of metal doped in the charge generation layer, thereby stably operating even when applied to large-area displays.

Figure 1:
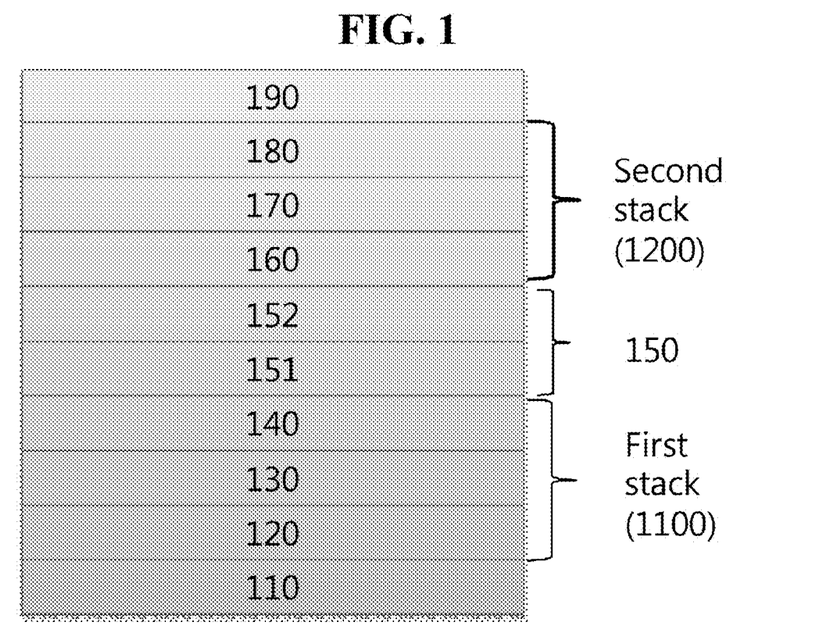
FIG. 1 is a sectional view illustrating a tandem white organic light emitting device according to the present invention.

FIG. 1 is a sectional view illustrating a tandem white organic light emitting device according to the present invention.

As shown in FIG. 1, the tandem white organic light emitting device according to the present invention includes a first electrode 110 and a second electrode 190 opposing each other, a charge generation layer 150 disposed between the first electrode 110 and the second electrode 190, a first stack 1100 including a first light emitting layer 130 emitting blue light, disposed between the first electrode 110 and the charge generation layer 150, and a second stack 1200 including a second light emitting layer 170 including one, or two or more hosts doped with a phosphorescent dopant emitting light having a longer wavelength than blue light, disposed between the charge generation layer 150 and the second electrode 190.

Also, the charge generation layer 150 comprises an n-type charge generation layer 151 doped with a metal, and a p-type charge generation layer 152 made of an organic material.

The first stack 1100 further includes a first common layer 120 interposed between the first electrode 110 and the first light emitting layer 130, and a second common layer 140 interposed between the first light emitting layer 130 and the charge generation layer 150, and the second stack 1200 further includes a third common layer 160 interposed between the charge generation layer 150 and the second light emitting layer 170, and a fourth common layer 180 interposed between the second light emitting layer 170 and the second electrode 190.

For example, the first common layer 120 may be a first hole transport layer, the second common layer 140 may be a second electron transport layer, the third common layer 160 may be a second hole transport layer, and the fourth common layer 180 may be a second electron transport layer. In this case, the first electrode 110 serves as an anode and the second electrode 190 serves as a cathode.

In some cases, when the first electrode 110 is a cathode and the second electrode 190 is an anode, an order of the first to fourth common layers 120, 140, 160 and 180 may be the reverse of the order described above. That is, the second electron transport layer, the second hole transport layer, the first electron transport layer and the first hole transport layer are determined in this order.

When the first common layer 120 is a first hole transport layer, a hole injection layer adjacent to the first electrode 110 may be further formed, and when the fourth common layer 180 is a second electron transport layer, an electron injection layer adjacent to the second electrode 190 may be further formed.

Also, the first or second hole transport layer, or the first or second electron transport layer may have a single or multiple layer structure. Also, when these layers are formed as a single layer, they may be formed by mixing or codepositing a plurality of functional materials. Also, if desired, these hole transport layers or electron transport layers may be integrated with the light emitting layer of the corresponding stack.

Such a white organic light emitting display device realizes white light by combination of blue light emitted from the first light emitting layer 130 of the first stack 1100 and phosphorescent light emitted from the second stack 1200. The color of light emitted from the second stack 1200 depends on a phosphorescent dopant contained in the second light emitting layer 170 and the phosphorescent dopant is for example a single yellow green phosphorescent dopant, or a combination of a yellow phosphorescent dopant and a green phosphorescent dopant, or a combination of a red phosphorescent dopant and a green phosphorescent dopant. Any color phosphorescent dopant may be also used as long as it combines with blue light emitted from the first stack 110 to emit white light.

The first light emitting layer 130 may use a material capable of emitting blue fluorescence or blue phosphorescence. In the tests described below, the tests are carried out using a blue fluorescence material due to characteristics of materials developed to date.

Here, the second light emitting layer 170 includes a host as a main component, in addition to the phosphorescent dopant. The host may be a single host or two or more hosts in order to enhance hole transport properties or electron transport properties. For phosphorescence, the second light emitting layer 170 is formed by doping a host with about 10% or less of a phosphorescent dopant, based on the content of the host.

Meanwhile, as an example described above, the first electrode 110 is an anode formed of a transparent electrode such as ITO, and the second electrode 190 is a cathode formed of a reflective metal electrode such as Al.

However, the present invention is not limited to the described example. The up and down positions of the first stack 1100 and the second stack 1200 may be reverse. That is, the second stack as a phosphorescent stack may be disposed in an upper part of the first stack as a blue fluorescence stack. The thicknesses of respective common layers may be changed depending on up and down positions of respective stacks.

Also, the first electrode 110 may be deposited on a substrate (not shown) and first and second stacks may be deposited thereon. Alternatively, in reverse order, the second electrode 190 may be deposited, and second and first stacks may then be deposited thereon.

One of the first electrode 110 and the second electrode 190 is a transparent electrode such as ITO, IZO or ITZO and the other is a reflective electrode such as Al or Mg.

Meanwhile, the charge generation layer (CGL) 150 functions to balance charges between the first stack 1100 and the second stack 1200 that are adjacent to each other and is thus also referred to as an "intermediate connection layer" (ICL). In this case, the charge generation layer 150 may be divided into an n-type charge generation layer 151 that assists injection of electrons into the first stack 1100 and a p-type charge generation layer 152 that assists injection of holes into the second stack 1200.

Here, the metal doped in the n-type charge generation layer is selected from Group I (alkali metal) or Group II (alkaline earth metal) metals. For example, the metal may be any one of lithium (Li), sodium (Na), magnesium (Mg), calcium (Ca) and cesium (Cs).

Also, an amount of metal doped in the n-type charge generation layer 151 is preferably 1% to 10% of the total volume of the n-type charge generation layer, more preferably 2% to 8%, in order to more efficiently transport carriers such as electrons or holes to adjacent stacks and prevent lateral leakage caused by conductivity.

Also, the thickness of metal doped in the n-type charge generation layer 151 is preferably set to 50 Å to 200 Å, more preferably about 100 Å to 150 Å. Such a thickness is also determined in order to prevent lateral leakage of the n-type charge generation layer 151 and increase carrier transport efficiency.

Such an n-type charge generation layer 151 serves as an electron transport layer and an electron injection layer, from the standpoint of the first stack 1100. Also, the n-type charge generation layer 151 is formed by doping an electron transport material as a main material with an alkali or alkaline earth metal.

For example, the n-type charge generation layer 151 may have a fused aromatic ring containing a hetero ring as an electron transport material.

Meanwhile, the p-type charge generation layer 152 has a HOMO energy level of −5 eV or less and serves as a hole transport layer, from the standpoint of the second stack. Such a p-type charge generation layer 152 contains a hole transport material.

Meanwhile, the third common layer 160 and the fourth common layer 180 have a triplet energy level 0.01 eV to 0.4 eV higher than that of the host present in the second light emitting layer 170 so that the second stack 1200 that phosphorescents prevents introduction of an excited state of triplet exitons into the third common layer 160 or the second common layer 180 and confines the same in the second light emitting layer 170.

In addition, the first stack 1100 that emits blue fluorescence is an element that exhibits high efficiency and long lifetime in consideration of triplet-triplet annihilation (TTA).

That is, the first stack 1100 has a device structure design so that it increases limited internal quantum efficiency (IQE) of a fluorescence element from 25% to about 50%, based on contribution of delayed fluorescence through TTA and thereby facilitates TTA in the first light emitting layer 130 for contribution of efficiency based on TTA.

That is, as ΔEst (exchange energy between singlets and triplets) of the host and dopant of the first light emitting layer 130 decreases, conversion of triplets into singlets through TTA is easy. In order to effectively confine triplet exitons in the first light emitting layer 130, a triplet energy of the first common layer 120 and the second common layer 140 should be higher than a triplet energy of the fluorescence host. A fluorescence blue stack with high efficiency can be obtained by optimizing carrier mobility of the first and second common layers 120 and 140 given that these conditions are satisfied.

In addition, the second stack 1200 is formed by doping a combination of a host having superior hole transport properties and a host having superior electron transport properties with a phosphorescent dopant (yellow-green phosphorescent dopant, or yellow and green phosphorescent dopants, or red and green phosphorescent dopants or the like).

In accordance with the present invention, as can be seen from the following test, the optimum charge generation layer is determined by observing variation of characteristics of tandem white organic light emitting device according to change of respective charge generation layer structures.

In the following test, referring to a sectional view of FIG. 1, the light emitting layer of the first stack (fluorescence stack) is realized by a blue fluorescence layer and the light emitting layer of the second stack (phosphorescence stack) is realized by a yellow-green phosphorescence layer.

Figure 2:
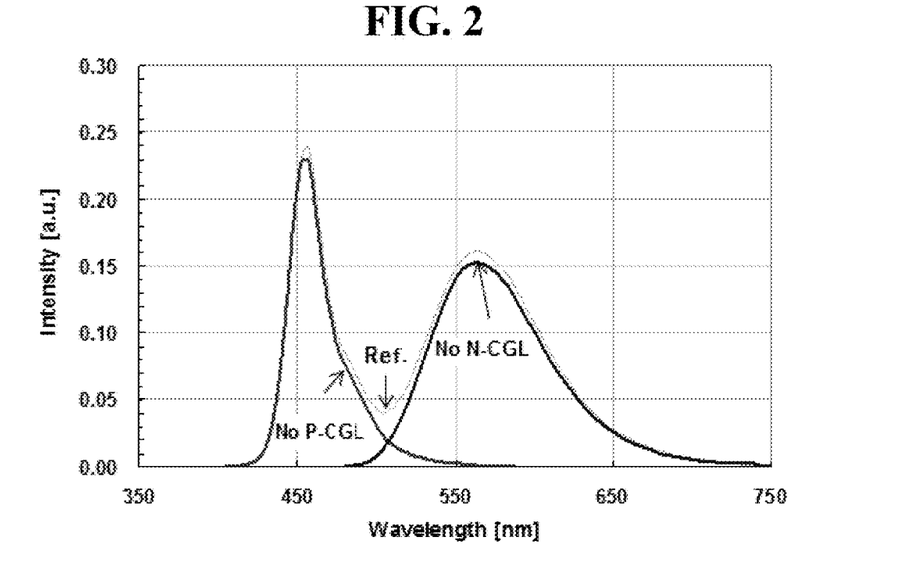
FIG. 2 is a graph showing luminous intensity as a function of a wavelength in a tandem white organic light emitting device in which an n- or p-type charge generation layer is omitted.
Figure 3:
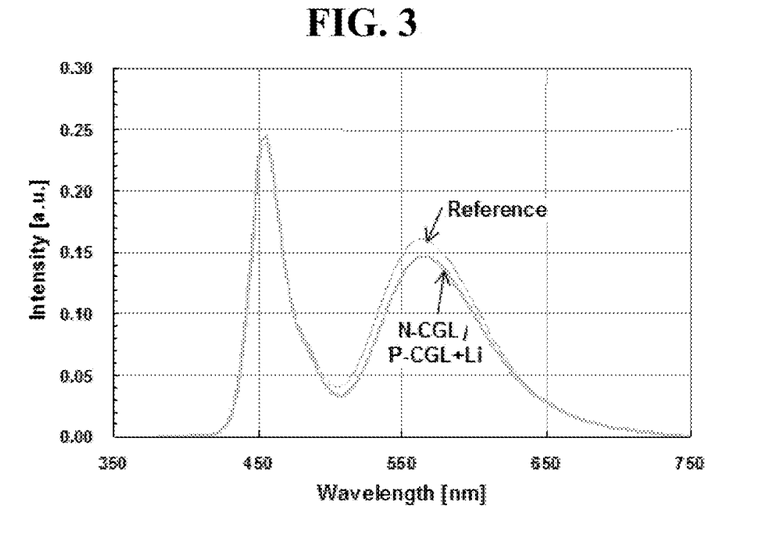
FIG. 3 is a graph showing an intensity of light as a function of wavelength, according to doping a p-type charge generation layer with a metal.
Figure 4:
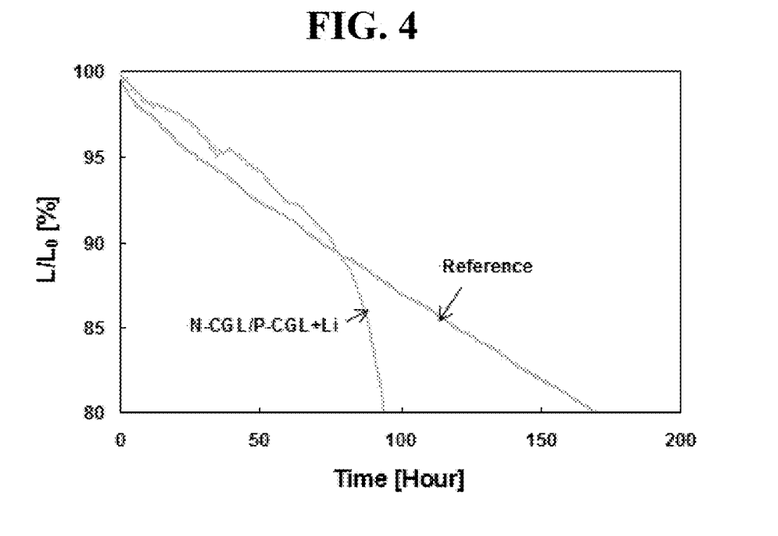
FIG. 4 is a graph showing lifetime according to doping a p-type charge generation layer with a metal.

Hereinafter, a configuration of a test example will be described in brief. The following test example is a reference example in which both an n-type charge generation layer and a p-type charge generation layer shown in FIGS. 2 to 4 are present and an amount and a thickness of metal doped in the n-type charge generation layer is about 3% and 100 Å, respectively.

[Test Example]

Hereinafter, a process of forming a tandem white organic light emitting device according to the present invention will be briefly described.

This test example is provided only for illustration. The materials for the following layers are not limited as described below and other materials may be also used so long as functionalities of the corresponding layers are maintained.

A thin film transistor array including thin film transistors (not shown) disposed in respective pixels in the form of a matrix is formed on a transparent substrate (not shown).

Then, as shown in FIG. 1, a first electrode 110 is formed using an anode material such that it is connected to the thin film transistor. Indium tin oxide (ITO) is generally used as the anode material.

Then, a first common layer 120 is formed on the first electrode 110. The first common layer 120 is formed by sequentially depositing HAT-CN (Formula 1) to a thickness of 50 Å, NPD (Formula 2, 4,4'-bis[N-(1-naphthyl)-N-phenylamino]-biphenyl) and N,N'-diphenyl-N-naphthyl-N'-biphenyl-1,1'-biphenyl-4,4"-diamine to a thickness of 1,250 Å, and depositing TCTA (Formula 3) to a thickness of 200 Å.

Then, a first light emitting layer 130 is formed on the first common layer 120. The first light emitting layer 130 is formed to a thickness of about 250 Å including ADN (Formula 4) and tBu-perylene (Formula 5).

Then, a second common layer 140 is formed on the first light emitting layer 130. The second common layer 140 is formed to a thickness of about 250 Å using LGC ETL (Formula 6).

Then, an n-type charge generation layer 151 and a p-type charge generation layer 152 are sequentially deposited. The n-type charge generation layer 151 is formed to a thickness of about 100 Å using BPhen (Formula 7) doped with 3% of lithium, and the p-type charge generation layer 152 is formed to a thickness of about 100 Å using HAT-CN.

Then, a third common layer 160 is formed on the p-type charge generation layer 152. The third common layer 160 is formed by continuously depositing NPD and TCTA to thicknesses of 450 Å and 200 Å, respectively.

Then, the second light emitting layer 170 is formed on the third common layer 160.

The second light emitting layer is formed to a thickness of 300 Å as a light emitting layer including BAlq (Formula 8) and an YG dopant (Formula 9).

Then, a fourth common layer 180 is formed on the second light emitting layer 170. The fourth common layer 180 is formed by continuously depositing LGC ETL and LiF to thicknesses of about 350 Å and about 10 Å, respectively.

Then, a second electrode 160 is formed as a cathode on the fourth common layer 180 using a reflective metal such as Al.

[Formula 1]

[Formula 2]

[Formula 3]

[Formula 4]

[Formula 5]

-continued

[Formula 6]

[Formula 7]

[Formula 8]

[Formula 9]

First, in order to evaluate effects of the n-type charge generation layer and the p-type charge generation layer on tandem devices, an example, in which one of the two types of charge generation layers is selectively omitted, is compared with an reference (ref.) example in which both of the two charge generation layers are present.

TABLE 1

| ID | Volt (V) | Cd/A | CIEx | CIEy | EQE |
|---|---|---|---|---|---|
| Ref. | 6.90 | 80 | 0.323 | 0.338 | 32 |
| NoN-CGL | 10.24 | 69.8 | 0.454 | 0.536 | 20.46 |
| NoP-CGL | 19.54 | 6.5 | 0.142 | 0.067 | 9.85 |

FIG. 2 is a graph showing luminous intensity as a function of a wavelength in a tandem white organic light emitting device in which the n- or p-type charge generation layer is omitted.

In the test of Table 1 and FIG. 2, a current density was 10 mA/cm$^2$.

As shown in FIG. 2, the reference example (ref.) including both the n-type charge generation layer and the p-type charge generation layer exhibits peak values at a wavelength corresponding to color of light emitted from the light emitting layers in the first stack and the second stack.

On the other hand, in the example (No N-CGL) in which only the n-type charge generation layer is omitted, only the light emitting layer of the second stack (phosphorescence stack) emits light, and in the example (No P-CGL) in which only the p-type charge generation layer is omitted, only the light emitting layer of the first stack (fluorescence stack) emits light. That is, it can be seen that, in a case in which the n- or p-type charge generation layer is selectively omitted, the second or first stack independently emits light.

In addition, as can be seen from Table 1, as compared to the reference (ref.) example (an example in which two types of charge generation layers are present), the example (No N-CGL), in which the n-type charge generation layer is omitted, exhibits an increase in driving voltage of 3V or more, which means that the example exhibits function of the only second stack (phosphorescence stack). The reason for this behavior is thought to be that all organic layers from the first common layer 120 to the second common layer 140 corresponding to the first stack are affected by the hole injection layer of the second stack (phosphorescence stack) and the first light emitting layer 130 and the second common layer 140 are main factors increasing a driving voltage. This results from non-injection of electrons from the p-type charge generation layer 152 to the second common layer 140.

In addition, as can be seen from Table 1, as compared to the reference example (ref.), in which two types of charge generation layers are present, the example (No P-CGL), in which the p-type charge generation layer is omitted, exhibited a 13V increase in driving voltage, which means that this example exhibits only function of the first stack.

This increase in driving voltage is thought to be due to the facts that an electron injection barrier is increased due to great energy level difference at the interface between the third common layer and the n-type charge generation layer introduced into the second stack (phosphorescence stack) and the hole transport layer of the second stack serves as an electron flow channel.

As such, when an n-type or p-type charge generation layer is present as the charge generation layer, the second stack and the first stack function independently and a driving voltage increases. Through the afore-mentioned tests, it can be seen that different types of charge generation layers are stacked as the charge generation layer.

FIG. 3 is a graph showing an intensity of light as a function of wavelength, according to doping the p-type charge generation layer with a metal. FIG. 4 is a graph showing lifetime according to doping the p-type charge generation layer with a metal.

When the p-type charge generation layer (P-CGL) is doped with an alkali metal, as shown in FIG. 3, lifetime is rapidly decreased since 90 hours, as shown in FIG. 4. This is due to the fact that combination of the p-type charge generation layer and an alkali metal causes injection efficiency of holes into the second stack and thus deteriorates change balance.

On the other hand, the n-type charge generation layer having a stack structure in which the p-type charge generation layer is not doped with an alkali metal exhibits a linear decrease in lifetime over time. This case enables stable driving, as compared to when the p-type charge generation layer is doped with an alkali metal.

As such, in order to realize an optimum tandem device, the structure of the optimum tandem device should be determined such that each charge generation layer can function efficiently.

The tandem white organic light emitting device according to the present invention suggests an optimum charge generation layer through observation of variation in characteristics of a tandem device under respective charge generation layer conditions. In particular, among the charge transport layers of the tandem white organic light emitting device, metal doping concentration and thickness of the n-type charge generation layer that more directly affects efficiency and lifetime of the device are controlled.

In the following test, the n-type charge generation layer uses a fused aromatic ring-based organic material as a main component and lithium (Li) is used as an alkali or alkaline earth metal doped therein.

Figure 5:
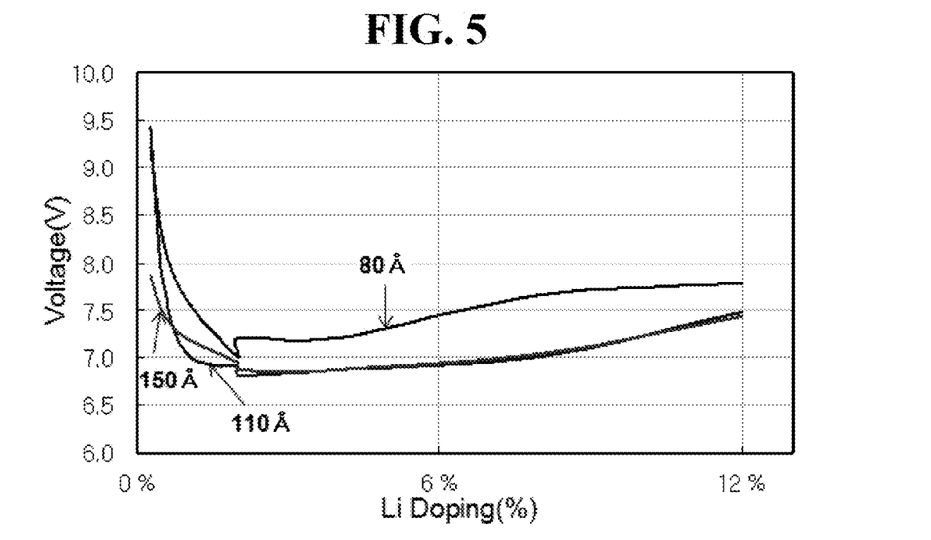
FIG. 5 is a graph showing variation in driving voltage according to lithium doping concentration under different thickness conditions of an n-type charge generation layer.

FIG. 5 is a graph showing variation in driving voltage according to lithium doping concentration under different thickness conditions of the n-type charge generation layer.

As shown in FIG. 5, when a lithium doping concentration increases, while the thickness of the n-type charge generation layer increases 80 Å, 110 Å and 150 Å in this order, the driving voltage increases at all thicknesses and at an amount of lithium of 2% or less.

This means that lithium plays an important role in injection of electrons produced in the p-type charge generation layer into the n-type charge generation layer and this behavior is related to driving voltage. That is, when lithium is doped to at least 2%, driving voltage can be maintained at about 7.0V without great increase.

Meanwhile, as can be seen from this graph, when a lithium doping concentration is 2% to 12%, driving voltage is almost not varied or broadly increases to 7.8V or less, as the lithium doping concentration increases. Accordingly, when a lithium doping concentration is 2% to 12%, low driving voltage can be obtained.

In addition, it can be seen from the graph of FIG. 5, that the thickness of the n-type charge generation layer also affects driving voltage at the same lithium doping concentration.

For example, when the thickness of the n-type charge generation layer is 110 Å to 150 Å, variation in driving voltage according to variation in lithium doping concentration is almost not observed, but when the thickness of the n-type charge generation layer is 80 Å, the driving voltage exhibited an increase of about 0.5V. This is thought to be caused by injection of electrons produced in the p-type charge generation layer into the n-type charge generation layer, when the thickness of the n-type charge generation layer is small.

Figure 6:
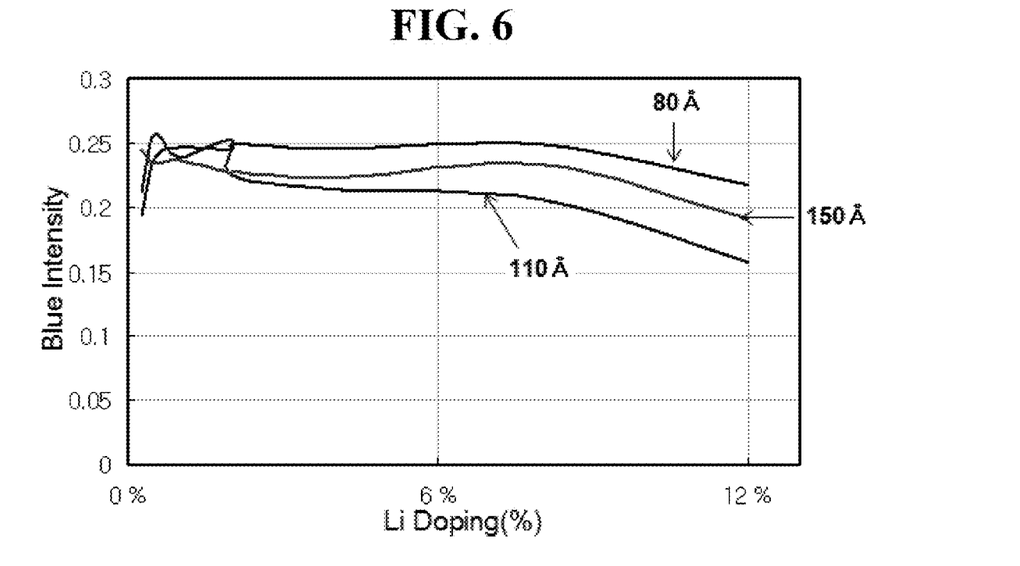
FIG. 6 is a graph showing luminous intensity of a blue stack according to lithium doping concentration at different thicknesses of an n-type charge generation layer.

FIG. 6 is a graph showing luminous intensity of a blue stack according to lithium doping concentration at different thicknesses of the n-type charge generation layer.

As shown in FIG. 6, when an amount of lithium doped in the n-type charge generation layer is about 2% to 8%, the blue stack (first stack) exhibits constant blue luminous efficacy at respective thicknesses and at a luminous intensity of 0.2 to 0.25. However, the luminous efficacy rapidly decreases at respective thicknesses at a lithium doping concentration of 1% or less, but broadly decreases at a lithium doping concentration higher than 8%.

That is, when an amount of lithium doped in the n-type charge generation layer is about 2% to 8%, injection of electrons from the n-type charge generation layer to the first stack enables charge balance and is optimized, and electrons are injected in excessively small or large amounts under other conditions.

Figure 7:
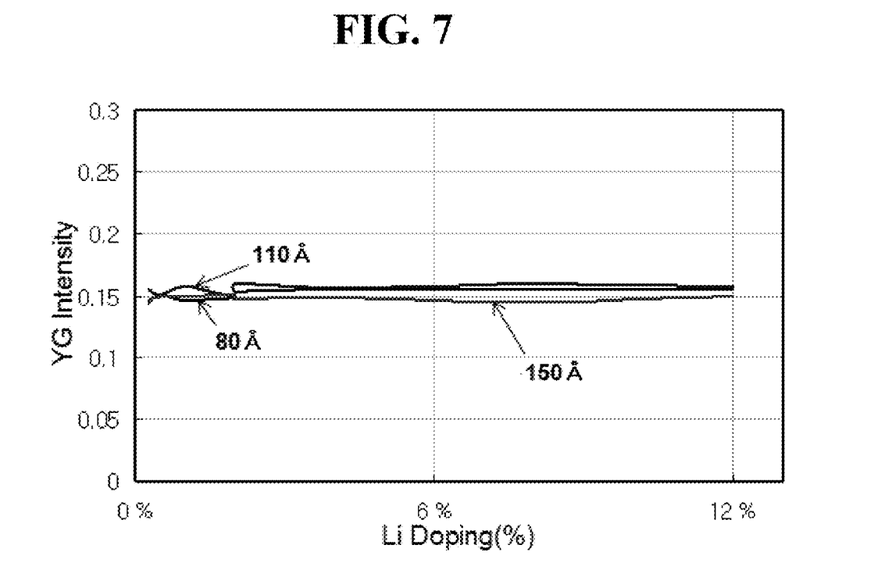
FIG. 7 is a graph showing luminous intensity of a phosphorescence stack according to lithium doping concentration at different thicknesses of an n-type charge generation layer.

FIG. 7 is a graph showing luminous intensity of a phosphorescence stack according to lithium doping concentration at different thicknesses of the n-type charge generation layer.

As shown in FIG. 7, the second stack (phosphorescence stack) exhibits yellow-green phosphorescence luminous intensity of about 0.15, regardless of an amount of lithium doped in the n-type charge generation layer, which means that luminous intensity of the second stack is greatly not affected by metal (Li) doping concentration.

This is thought to be due to the facts that electrons and holes are produced between the p-type charge generation layer and the hole transport layer adjacent thereto, and the conditions of the n-type charge generation layer greatly affect injection and transport of electrons into the first stack and do not greatly affect injection of holes into the second stack.

Hereinafter, lifetime of the first and second stacks of the tandem white organic light emitting device according to the present invention will be described. In the following test, current density is set to 50 mA/cm$^2$.

Figure 8:
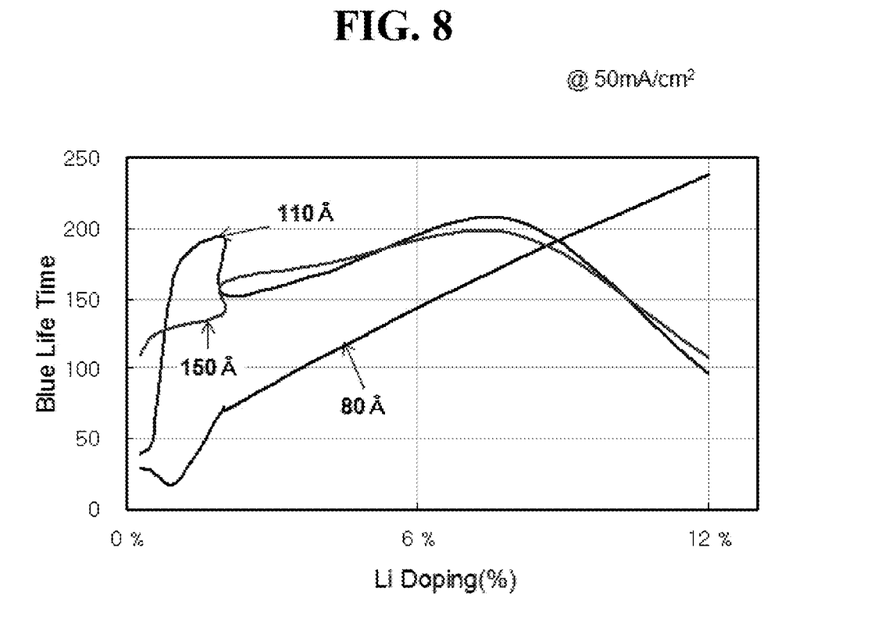
FIG. 8 is a graph showing lifetime of a blue light emitting layer according to lithium doping concentration at different thicknesses of an n-type charge generation layer.

FIG. 8 is a graph showing lifetime of the blue light emitting layer according to lithium doping concentration at different thicknesses of the n-type charge generation layer.

As shown in FIG. 8, variation in lifetime of the first stack (blue fluorescence stack) is sensitive to lithium doping concentration.

When the n-type charge generation layer has a thickness of about 110 Å to 150 Å, it exhibits similar lifetime properties, and when the lithium doping concentration is 2% or less, or 8% or more, the first stack exhibits a rapid decrease in lifetime. This is caused by deterioration in device characteristics due to formation of excitons at the interface between the light emitting layer and the common layer, which results from variation in charge balance, in consideration of variation in blue luminous efficacy according to lithium doping concentration. Also, when a lithium doping concentration is 2% to 8%, a lifetime of 150 hours or longer is secured.

However, when the n-type charge generation layer has a thickness of about 80 Å, lifetime linearly increases at a lithium doping concentration of 2% or more, but lifetime considerably decreases to 150 hours or less at a lithium doping concentration of 6% or less, as compared to the phosphorescence stack. Accordingly, it may be thought that when the thickness of the n-type charge generation layer in the first stack (fluorescence stack) of the white organic light emitting device is excessively small, lifetime cannot be suitably maintained.

From the afore-mentioned test, it can be seen that the n-type charge generation layer has a thickness of about 100 Å to 150 Å and a lithium doping concentration is 2% to 8%, the first stack can secure a lifetime of 150 hours or longer.

Meanwhile, it can be seen from the afore-mentioned graph that lifetime increases in proportion to metal doping concentration, but lifetime characteristics are poor under doping condition of 9% or less. That is, a lower limit of the metal doping concentration is required.

Figure 9:
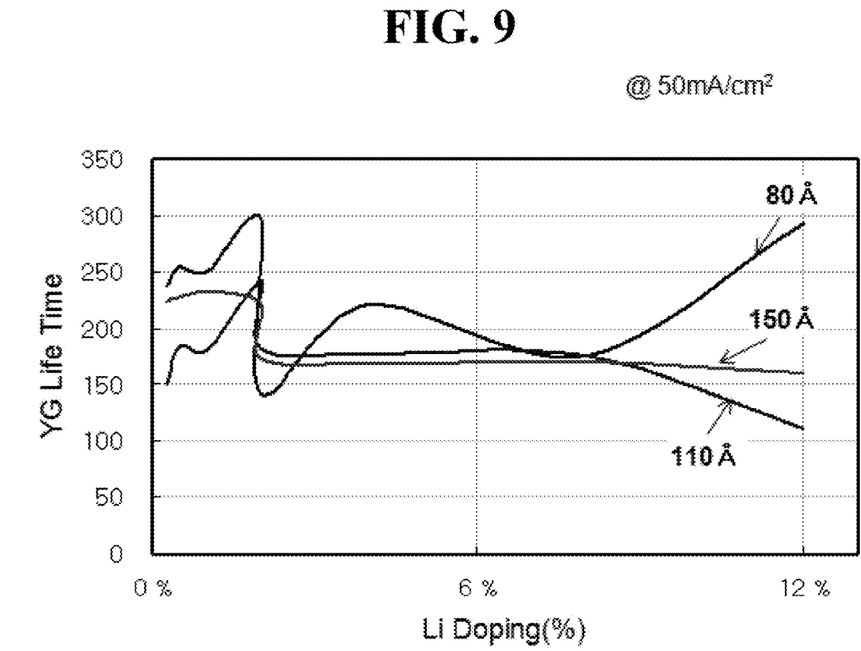
FIG. 9 is a graph showing lifetime of a phosphorescence light emitting layer according to metal doping concentration at different thicknesses of an n-type charge generation layer.

FIG. 9 is a graph showing lifetime of the phosphorescence light emitting layer according to metal doping concentration at different thicknesses of the n-type charge generation layer.

As shown in FIG. 9, regarding variation in lifetime of the second stack (phosphorescence stack) according to lithium doping concentration, lifetime behaviors are greatly varied at a lithium doping concentration of about 2% and lifetime behaviors are changed according to thicknesses at a lithium doping concentration of about 8%.

That is, lifetime is decreased at a lithium doping concentration of 2% or less, when the n-type charge generation layer has a thickness of about 80 Å to about 110 Å. Here, constancy of lifetime cannot be secured at a lithium doping concentration of 2% to 8%, when the n-type charge generation layer has a thickness of about 80 Å. Within this range, a lifetime of 150 hours or longer can be secured.

Also, a predetermined lifetime of 180 hours is substantially maintained at a lithium doping concentration of 2% to 8%, when the n-type charge generation layer has a thickness of 110 Å.

In addition, a predetermined lifetime of about 230 hours is maintained at a lithium doping concentration of 2% or less, when the n-type charge generation layer has a thickness of 150 Å, and a lifetime of 170 to 180 hours is maintained at a lithium doping concentration of 2% to 8%, as in the case in which the thickness of the n-type charge generation layer is 110 Å.

It can be seen from the afore-mentioned graph that, within a lithium doping concentration range of 2% to 8%, this case exhibits substantially similar lifetime behavior to the blue fluorescence stack of FIG. 8 in which the n-type charge generation layer is doped with the same amount of lithium. That is, within the afore-mentioned thickness range, the first stack (blue fluorescence stack) and the second stack (yellow green phosphorescence stack) exhibit similar lifetime behaviors. In addition, as described in the test results of FIG. 8, lifetime of the first stack of 150 hours or longer is secured, when the n-type charge generation layer has a thickness of about 100 Å to about 150 Å and a lithium doping concentration is 2% to 8%.

Figure 10:
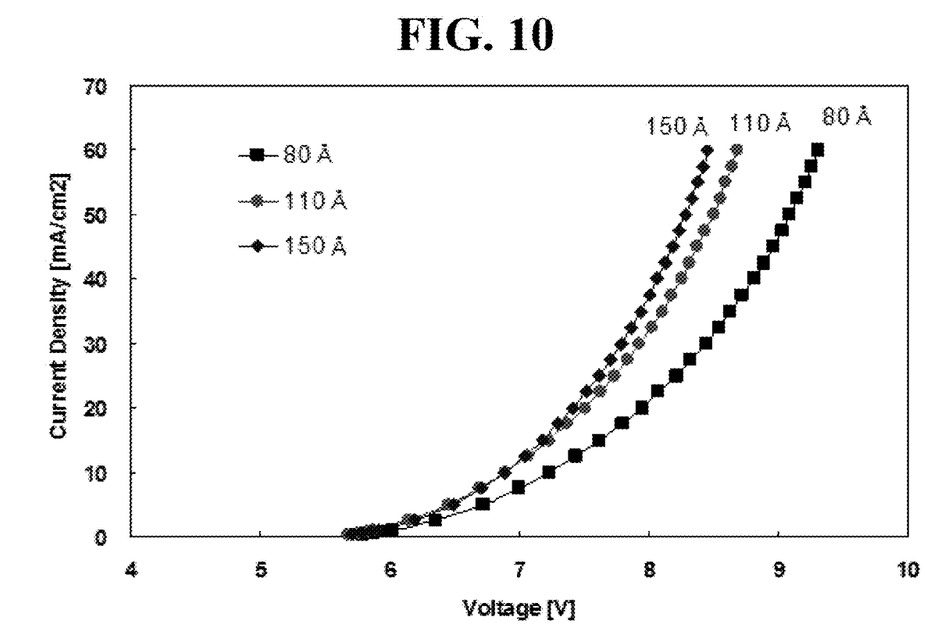
FIG. 10 is a graph showing current intensity according to driving voltage at different thicknesses of an n-type charge generation layer.

FIG. 10 is a graph showing current intensity according to driving voltage at different thicknesses of the n-type charge generation layer.

As shown in FIG. 10, as the thickness of the n-type charge generation layer decreases, the driving voltage increases. The reason for this is that conductivity of the n-type charge generation layer is superior and injection of electrons into the first stack is efficient.

Meanwhile, the metal doped in the n-type charge generation layer is not limited to lithium and may be an alkali metal or an alkaline earth metal. When other metal is used instead of lithium, the doping concentration or the thickness of the n-type charge generation layer, enabling long lifetime and high efficiency, may be changed. Such a doping concentration is about 1% to about 10%. Also, the thickness of the n-type charge generation layer is about 50 Å to about 200 Å.

Since the n-type charge generation layer exhibits superior conductivity, as compared to the p-type charge generation layer, it is vulnerable to lateral leakage. Accordingly, after doping concentration and thickness enabling prevention of lateral leakage are considered, conditions enabling functions optimized for tandem devices should be applied. These test conditions are determined to avoid lateral leakage and obtain optimum efficiency and lifetime. When the n-type charge generation layer has a thickness of about 100 Å to about 150 Å and a lithium doping concentration is 2% to 8%, a lifetime of the first stack of 150 hours or longer is secured.

Meanwhile, the tandem white organic light emitting device according to the present invention may be applied to displays. From small size displays to large-size displays, the distance between pixels may be changed. Accordingly, this causes change of the standard of lateral leakage. As a result, when the tandem white organic light emitting device according to the present invention is applied to displays, the thickness of the n-type charge generation layer may be changed under the afore-mentioned conditions according to pixel size of the displays.

The tandem white organic light emitting device according to the present invention has the following advantages.

First, a stack including an n-type charge generation layer and a p-type charge generation layer is formed as a charge generation layer formed at the interface of adjacent stacks in order to provide diode effects, thereby improving efficiency of electrons or holes transported to the adjacent stacks, without being trapped in the charge generation layer.

Second, the n-type charge generation layer is designed under specific conditions, thus preventing lateral leakage, improving charge transport, optimizing charge balance between a blue light emitting stack and a phosphorescence stack, and reducing a driving voltage and increasing lifetime in a tandem type structure. Also, as a result, tandem white organic light emitting devices can be stably realized.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A tandem white organic light emitting device comprising:
 a first electrode and a second electrode opposing each other;
 a charge generation layer formed between the first electrode and the second electrode;
 a first stack disposed between the first electrode and the charge generation layer, the first stack comprising a first light emitting layer emitting blue light; and
 a second stack disposed between the charge generation layer and the second electrode, the second stack comprising a second light emitting layer including one or more hosts doped with a phosphorescent dopant emitting light having a longer wavelength than blue light,
 wherein the charge generation layer comprises an n-type charge generation layer doped with a metal and a p-type charge generation layer made of an organic material and
 wherein an amount of metal doped in the n-type charge generation layer is 2% to 8% of the total volume of the n-type charge generation layer.

2. The tandem white organic light emitting device according to claim 1, wherein the metal doped in the n-type charge generation layer is a Group I or II metal.

3. The tandem white organic light emitting device according to claim 2, wherein the metal is any one of lithium, sodium, magnesium, calcium and cesium.

4. The tandem white organic light emitting device according to claim 1, wherein a thickness of the metal doped in the n-type charge generation layer is 100 Å to 150 Å.

5. The tandem white organic light emitting device according to claim 1, wherein a HOMO energy level of the p-type charge generation layer is −5 eV or less.

6. The tandem white organic light emitting device according to claim 1, wherein the n-type charge generation layer has a fused aromatic ring containing a hetero ring.

7. The tandem white organic light emitting device according to claim 1, wherein the first stack further comprises:
- a first common layer disposed between the first electrode and the first light emitting layer; and
- a second common layer disposed between the first light emitting layer and the charge generation layer, and the second stack further comprises:
- a third common layer disposed between the charge generation layer and the second light emitting layer; and
- a fourth common layer disposed between the second light emitting layer and the second electrode.

8. The tandem white organic light emitting device according to claim 7, wherein the third common layer and the fourth common layer have a triplet energy level 0.01 eV to 0.4 eV higher than a triplet energy level of the host present in the second light emitting layer.

9. The tandem white organic light emitting device according to claim 2, wherein the first light emitting layer emits blue fluorescence.

10. The tandem white organic light emitting device according to claim 2, wherein a phosphorescent dopant of the second light emitting layer comprises a yellow-green phosphorescent dopant.

11. The tandem white organic light emitting device according to claim 2, wherein a phosphorescent dopant of the second light emitting layer comprises a yellow phosphorescent dopant and a green phosphorescent dopant.

12. The tandem white organic light emitting device according to claim 2, wherein a phosphorescent dopant of the second light emitting layer comprises a red phosphorescent dopant and a green phosphorescent dopant.

13. The tandem white organic light emitting device according to claim 1, wherein the second light emitting layer comprises two or more hosts and the hosts include at least first host having an electron transport property and a second host having a hole transport property.

* * * * *